United States Patent [19]

McGrew

[11] 4,204,881
[45] May 27, 1980

[54] SOLAR POWER SYSTEM

[76] Inventor: Stephen P. McGrew, 4624 W. 34th St., Spokane, Wash. 99204

[21] Appl. No.: 947,488

[22] Filed: Oct. 2, 1978

[51] Int. Cl.² .......................................... H01L 31/04
[52] U.S. Cl. ............................... 136/89 PC; 126/438; 136/89 CA; 136/206; 350/162 R; 350/162 ZP; 350/211
[58] Field of Search ............. 136/89 PC, 206, 89 HY, 136/89 CA; 126/270, 271; 350/162 R, 162 ZP, 211, 3.70, 3.72, 3.73, 188

[56] References Cited

U.S. PATENT DOCUMENTS

| | | | |
|---|---|---|---|
| 3,578,845 | 5/1971 | Brooks et al. | 350/162 R |
| 3,821,549 | 6/1974 | Gloge | 250/211 J |
| 4,003,756 | 1/1977 | Abrams | 136/89 PC |
| 4,021,267 | 5/1977 | Dettling | 136/89 PC |
| 4,091,799 | 5/1978 | Steiner | 126/271 |

OTHER PUBLICATIONS

F. A. Jenkins et al., "Fundamentals of Optics," McGraw-Hill Book Co., 1957, pp. 347-348.

Primary Examiner—Aaron Weisstuch
Attorney, Agent, or Firm—Seed, Berry, Vernon & Baynham

[57] ABSTRACT

A system for generating electrical power from sunlight, comprising a focussing diffraction grating or other focussing, spectrally dispersive means and a photocell array. The diffraction grating focuses sunlight into a spectrally dispersed band. The photocell array is composed of cells with different spectral sensitivities, located in positions in the dispersed band corresponding to the cell spectral sensitivities so that the net conversion efficiency of sunlight to electricity exceeds the conversion efficiency attainable with nondispersive collectors and single material photocells. Alternate embodiments of the invention provide sun tracking means, reflective or transmissive diffraction gratings, flat or curved diffraction grating surfaces, on- or off-axis focus, and optical coatings on the photocell surfaces.

11 Claims, 6 Drawing Figures

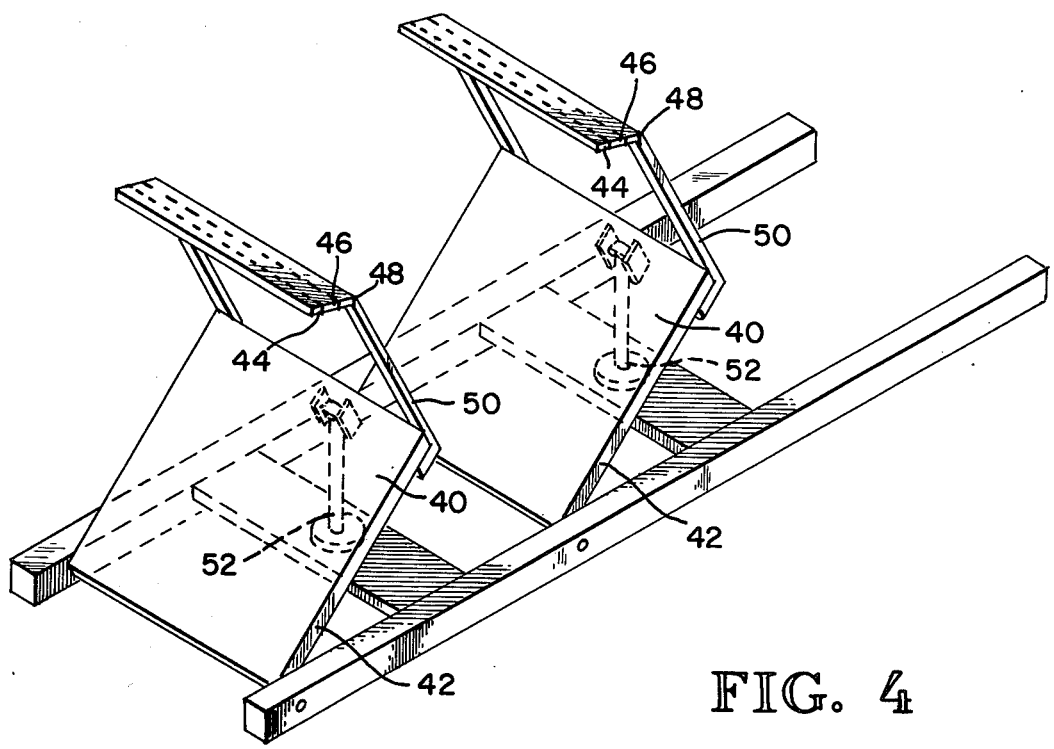
FIG. 4
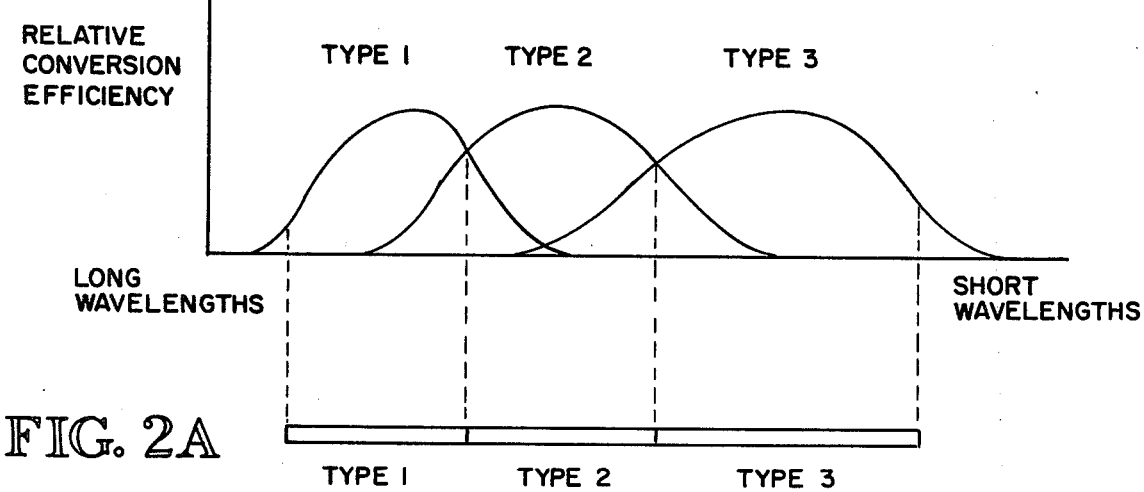
FIG. 2
FIG. 2A

SOLAR POWER SYSTEM

BACKGROUND OF THE INVENTION

1. Field of the Invention

This invention relates to solar power generation, and more particularly to multicolor solar power generation means.

2. Description of the Prior Art

A large body of work has been done on the subject of photocell materials. Considerable work has been done on the subject of optimum sunlight concentrating geometries. There has been speculation regarding constructing photovoltaic solar power systems using an assembly of dichroic filters and various photocell materials to achieve greater integrated conversion efficiency by taking advantage of the high efficiency of particular photocell materials in relatively small spectral ranges. An article summarizing the current state of the art appeared in the IBM Journal of Research & Development, Vol. 22, No. 2, March, 1978, entitled, "Novel Materials and Devices for Sunlight Concentrating Systems."

While the multicolor system described in the above article is expected to achieve greatly improved conversion efficiency, it suffers from certain inherent limitations, notably bulkiness, excessive weight, and consequent high cost.

U.S. Pat No. 4,021,267 discloses a system which has the same goal as the present invention, but accomplishes the goal (i.e., spectral separation of sunlight concentrated onto a photocell array) by an inherently less efficient and more complex, massive, cumbersome, and expensive method than is disclosed herein. U.S. Pat. No. 4,021,267 is based upon the reasonable but erroneous conclusion that "If an attempt is made to use the system with a concentrator without some form of collimation, the spectral separator will not efficiently separate all the light since the incident radiation to the spectral separator does not consist of parallel beams. As a result, a substantial portion of the light passing through the separator will still be "white." Thus, while in the inventor's system it is still necessary that the area of the photovoltaic cells be greater than the area of the spectral separator upon which the incident radiation impinges, the use of concentrator and collimating elements permits much higher intensity radiation to be passed to the photovoltaic cells through the spectral separator." That conclusion leads to his design which requires a three-element optical system: a concentrator, a collimator and a spectral separator.

There are several important disadvantages to the above system. First, it necessitates the use of three separate optical elements, each of which will have attendant and unavoidable optical losses with consequent reduction of overall collection efficiency. With such losses reasonably amounting to 20 or 30 percent in each optical element, overall loss can easily amount to more than 50 percent, with the losses thus offsetting the gain in photocell efficiency due to spectral separation.

Second, the degree of concentration and spectral separation attainable in the system is not optimum. Optimum concentration and spectral separation can only occur where the image of the sun is in focus on the photocells for any particular spectral component; yet the system described does not focus the sun's image on the photocells.

Third, with a three-element concentrating and separating system, the system is bulkier and heavier than is desirable.

The present invention accomplishes the desired task of optimum concentration and spectral dispersion with a single, very inexpensive optical element, thereby avoiding the need for additional optical elements, the attendant unavoidable light losses, and the additional structures required to support the additional optical elements.

While the concept of using spectrally separated light to obtain higher efficiencies in a photovoltaic generating system is known, the single-element spectrally dispersive collector disclosed herein and the generating systems constructed therefrom are entirely novel and represent significant advances in the art of solar power generation. Reflective, focussing diffraction gratings have been used in the past in spectrometers, but their use as concentrators and spectral separators of sunlight is entirely novel.

SUMMARY OF THE INVENTION

Various studies have shown that photovoltaic solar power generating plants will become economically practical when generating plant costs become less than $50.00 per square meter and overall conversion efficiencies become higher than 18 percent. The studies have also shown that busbar cost (the measure of generating costs and hence economic practicality) is much more strongly dependent on overall efficiency than on photovoltaic cell costs.

A primary object of the present invention is to provide a solar power generating system with greatly improved overall conversion efficiency and greatly reduced generating plant costs. Estimates based on the most recently available information indicate that the present invention will reduce busbar costs to the vicinity of 3 cents per kilowatt-hour, well below the accepted practical threshold cost of 5 cents per kilowatt-hour. For example, the present invention can result in a generating plant whose solar cell costs are below $50.00 per square meter, whose collector subsystem costs are below $40.00 per square meter, and whose overall conversion efficiency exceeds 25%, using the present invention in combination with existing technology.

It is a primary object of this invention to provide a solar electric power generating system with substantially improved overall conversion efficiency and lowered collector costs.

It is a further object of this invention to provide flat, inexpensive sunlight concentrators that efficiently focus sunlight into a spectrally dispersed line focus.

It is a further object of this invention to provide an improved solar electric power generating system capable of efficiently directing portions of the solar spectrum to solar cells made of materials with spectral response best suited to the particular portion of solar spectrum directed thereto.

These and other objects of the invention are provided by creating a single high efficiency optical element to serve as a spectrally dispersive sunlight concentrator, and placing an array of photocells or other like power converting means at the focus thereof. The types of photocells or other power converting means of the array are positioned in the spectrum imaged at the focus of the diffraction grating so that their various spectral responses are utilized optimally.

In one embodiment, the optical element is a surface relief reflection hologram (or replication thereof) created by recording the interference between two mutually coherent wavefronts, one of which is an off-axis cylindrical wavefront, and the other of which is a plane wavefront.

In another embodiment, the optical element is a blazed, ruled reflective diffraction grating.

In yet another embodiment, the optical element is a blazed, transmissive grating.

In yet another embodiment, the optical element is a blazed, off-axis, chromatically aberrated Fresnel lens.

In these and other embodiments, the power converting means may be an array of photocells arranged according to spectral response of the material of which they are composed.

BRIEF DESCRIPTION OF THE FIGURES OF THE DRAWINGS

FIG. 2 is a graph of relative conversion efficiency v. wavelength illustrating the spectral responses of three photocell types.

FIG. 2a illustrates the optimum photocell array for the photocell types of FIG. 2, assuming a linear dispersion of the spectrum according to wavelength.

FIG. 4 is a schematic representation of a preferred embodiment including sun tracking means to keep the system oriented toward the sun.

DETAILED DESCRIPTION OF THE INVENTION

It is advantageous to spectrally disperse sunlight in photovlotaic solar power systems since, by doing so, the different spectral responses of various photocell materials may be used to maximize overall conversion efficiency. For example, it has been shown (Alui, Backus and Masden; Conf. Record, 12th IEEE Photovoltaic Specialists Conference, Nov. 15–18, 1976) that the limit conversion efficiency of a multicolor, multicell system using gallium arsenide, silicon, and germanium photocells is 47%, while the limit conversion efficiency of a single cell system using gallium arsenide alone is only 34%. It is further advantageous to spectrally disperse the sunlight, since, by doing so, any portions of the spectrum which detract from photocell performance by heating more than they contribute by power generation can be selectively disposed of by reflection or separately used as a source of heat. Spectral dispersion further allows the use of antireflection coatings on the photocells graded to minimize reflection at the appropriate wavelengths.

Figure 1:
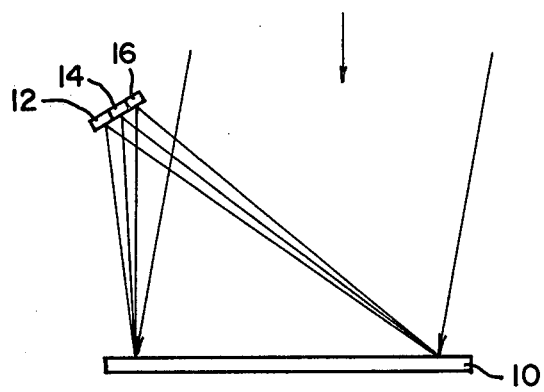
FIG. 1 is a schematic representation of one embodiment of the invention utilizing a flat blazed reflective diffraction grating and an array of photocells with different spectral responses.

One embodiment of the invention which utilizes a flat blazed reflective diffraction grating 10 and an array of photocells 12, 14 and 16 which various spectral responses is shown in FIG. 1.

A blazed diffraction grating is a surface relief diffraction grating whose grooves have a sawtooth shape with surfaces angled to optimize first order diffraction efficiency. It is advantageous to use a holographic diffraction grating because large, blazed, focussing diffraction gratings can be produced holographically with relative ease in photoresist media and replicated at low cost by embossing.

Figure 3:
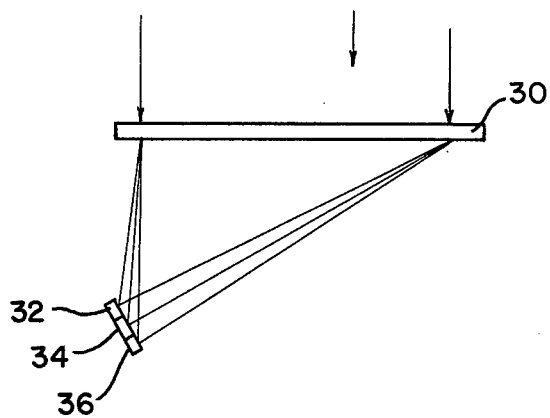
FIG. 3 is a schematic representation of another embodiment of the invention utilizing a flat, focussing, blazed transmissive grating.

Sunlight, being substantially collimated, is brought to a spectrally dispersed focus by the diffraction grating onto the photocells 12, 14 and 16. In this illustration, cell 16 receives the shortest wavelength portions of the spectrum while cell 12 receives the longest wavelength portions of the spectrum, because the red rays are deflected through a greater angle than the blue rays by the diffraction grating. Photocells are placed in the focal region because it is there that the optimum concentration and spectral separation are obtained. Minor defocussing will not seriously degrade system performance. For each part of the spectrum, the photocell of highest efficiency in that spectral range should be used. An example of the spectral responses of three hypothetical photocell types is shown in FIG. 2. In FIG. 2a, the corresponding optimum photocell array is shown, assuming a linear dispersion of the spectrum according to wavelength. Another embodiment is illustrated in FIG. 3 which utilizes a flat, focussing, blazed transmissive grating 30. In this embodiment sunlight is brought to a spectrally dispersed focus off-axis and converted by photocells 32, 34 and 36 as in the preceding embodiment.

It is advantageous to use flat diffraction gratings as spectrally dispersive sunlight concentrators because flat gratings can be inexpensively produced as thin sheets in large quantities by embossing, casting, or electroforming methods, and because structural support means can thus be particularly simple, e.g., flat plates of metal, wood or plastic. Concentration of sunlight is desirable because photocell efficiency is higher at elevated intensities. This is countered to some extent by degradation of cell efficiency due to heating. However, the fact that the disclosed system utilizes a substantially greater portion of the incident light to generate power implies that higher intensities can be used without excessive heating, because the light energy goes into generation of a greater amount of electrical energy and a lesser amount of heat energy. Furthermore, rejection of non-useful portions of the solar spectrum by reflection or separate absorption further reduces the heating of the photocells and allows operation at yet higher and more efficient sunlight concentrations.

Although even blazed diffraction gratings cannot be expected to be optically perfect, gratings have been produced with greater than 80% efficiency, comparable to the efficiency of curved solar concentrating mirrors. Curved gratings are possible but flat gratings are preferable because of lower cost and lower complexity of support structures. Current technology permits mass production of surface relief patterns such as flat reflective gratings by an embossing process at a cost less than $5.00 per square meter.

Suitable surface relief diffraction gratings may be produced by ruling machines in a conventional manner. They may also be produced by exposing a thin layer of photoresist on a transparent substrate to two coherent light beams incident from opposite sides of the substrate. In the latter case, the desired focussing properties and the dispersive properties can simultaneously be achieved by proper choice of light beam geometry as, for example, by the use of a plane wave traveling perpendicular to the surface of the substrate and a cylindrical wave whose axis is parallel to the surface of the substrate. The amount of spectral dispersion can be controlled by choice of the position of the axis of the cylindrical wave relative to the substrate. In this geometry, the angles of the Bragg planes recorded in the photoresist correspond to the optimum blaze angle, and careful development of the photoresist exposes surfaces corresponding closely to the Bragg planes.

Figure 5:
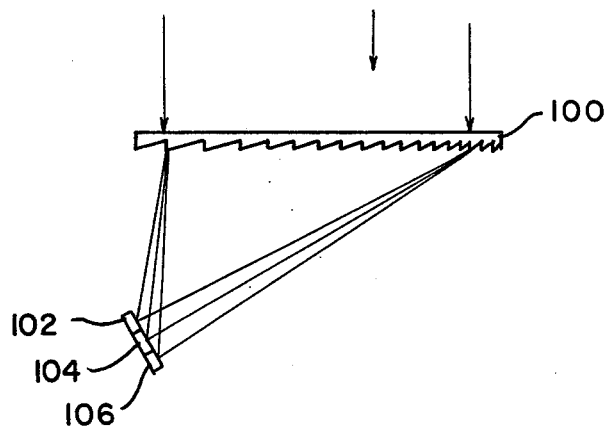
FIG. 5 is a schematic representation of an embodiment of the invention utilizing a spectrally dispersive Fresnel lens concentrator.

An alternate embodiment of the invention illustrated in FIG. 5 uses a concentrator 100 consisting of a Fresnel lens made of spectrally dispersive material and configured to have an off-axis focus. Ordinary glass and plastic materials are spectrally dispersive (i.e., their index of refraction is wave length dependent). The focus of such a concentrator is spectrally dispersed by an amount depending on the off-axis angle and the coefficient of spectral dispersion of the Fresnel lens material. Photocells 102, 104 and 106 are placed in the focal region as in the preceding embodiments.

Single element, high efficiency spectrally dispersive solar concentrators such as those disclosed herein are inherently more efficient than prior art concentrators for photovoltaic power conversion. Whereas in the three-element system such as described in U.S. Pat. No. 4,021,267 can be expected to have at best an overall conversion effieiency of about 20% (51% in the optical system and 40% in the photovoltaic system), the present system is expected to have at best an overall conversion efficiency of about 32% (80% in the optical system, 40% in the photovoltaic system).

Another significant advantage of the present invention is its simplicity of manufacture and construction. Either the spectrally dispersive off-axis Fresnel lens concentrator or the diffraction grating concentrators can be produced in large quantities and at very low cost. No other optical elements are needed. Eliminating other optical elements further reduces cost by eliminating the cost of the elements and their supporting structures.

An additional advantage of the present system is its reduced weight which is important for use in spacecraft.

Light energy converting means useful in this invention are not limited to photovoltaic cells. Other possible energy converting means include photochemical devices and fluorescent materials for absorption of high frequency light and re-emission of it at lower frequencies.

In most applications, some form of sun tracking ability is desirable. Such means may include systems to keep the entire system oriented toward the sun, or systems to keep the light energy conversion means positioned in the moving focus.

A preferred embodiment, illustrated in FIG. 4, includes the following: a reflective off-axis flat holographic cylindrical mirror 40 replicated from a photoresist hologram master by a continuous embossing process and metallized by a continuous vacuum metallizing process, a flat substrate 42 for the holographic mirror, ribbon-shaped thin film high efficiency photovoltaic cells 44, 46, 48 with a range of spectral response peaks covering the solar spectrum arranged to make optimum use of the available quasimonochromatic spectrally dispersed focussed sunlight, support means 50 to position the photocells in the focal region of the holographic mirror, and sun tracking means 52 to keep the system optimally oriented toward the sun. A suitable sun tracking means is a motorized tilting arm as shown.

I claim:

1. An efficient system for converting solar energy into useful energy, comprising:
   spectrally dispersive light concentrating means for redirecting said solar energy toward a spectrally dispersed focus, and light energy converting means positioned in the spectrally dispersed focus for converting the redirected solar energy into useful energy, said light energy converting means including at least one element whose spectral response is substantially matched to the spectral range of said redirected solar energy incident thereupon.

2. The system of claim 1 in which said concentrating means is an off-axis Fresnel lens formed in a medium of wavelength dependent refractive index.

3. The system of claim 1 in which said concentrating means is a blazed transmissive diffraction grating with off-axis focussing property.

4. The system of claim 3 in which said grating is a replicated blazed surface relief holographic lens.

5. The system of claim 1 in which said concentrating means is a blazed reflective diffraction grating with off-axis focussing property.

6. The system of claim 5 in which said grating is a replicated blazed surface relief reflection hologram.

7. The system of claim 1 in which said light energy converting means is composed of a plurality of photocell types, each photocell type being positioned in the focal region of the spectral components which it converts into electrical energy more efficiently than the other photocell types.

8. A method of concentrating and spectrally separating solar radiation for solar power generation comprising the step of exposing a focussing diffraction grating to said solar radiation such that said solar energy is redirected to a spectrally dispersed focus.

9. The method of claim 8 in which the diffraction grating is a replicated blazed surface relief off-axis holographic diffraction grating.

10. A method of spectrally separating and concentrating solar radiation comprising the step of exposing an off-axis Fresnel lens made from a substance with wavelength dependent refractive index to said solar radiation such that said solar energy is redirected to a spectrally dispersed focus.

11. An efficient, low cost solar power system comprising:
   a concentrating subsystem, said subsystem being an off-axis focussing embossed surface relief blazed holographic grating such that each spectral component of the incident sunlight hitting the grating is focussed in a different location;
   a light energy converter composed of an array of photovoltaic cell types, each type positioned in the focus of the concentrating subsystem such that it receives concentrated light of the colors which is converts most efficiently to electrical energy;
   supporting structures for said concentrating subsystem and said light energy converter; and
   sun tracking means to maintain optimal orientation of said concentrating subsystem and said light energy converter relative to the direction of incident sunlight.

* * * * *